(12) United States Patent
Fitzpatrick et al.

(10) Patent No.: US 12,112,049 B2
(45) Date of Patent: Oct. 8, 2024

(54) REDUCING ENERGY CONSUMPTION OF SELF-MANAGED DRAM MODULES

(71) Applicant: ScaleFlux, Inc., San Jose, CA (US)

(72) Inventors: Kelly Fitzpatrick, Laguna Niguel, CA (US); Yang Liu, Milpitas, CA (US); Tong Zhang, Albany, NY (US)

(73) Assignee: SCALEFLUX, INC., San Jose, CA (US)

( * ) Notice: Subject to any disclaimer, the term of this patent is extended or adjusted under 35 U.S.C. 154(b) by 86 days.

(21) Appl. No.: 18/051,150

(22) Filed: Oct. 31, 2022

(65) Prior Publication Data

US 2024/0143200 A1    May 2, 2024

(51) Int. Cl.
    *G06F 3/06* (2006.01)
(52) U.S. Cl.
    CPC .......... *G06F 3/0625* (2013.01); *G06F 3/0631* (2013.01); *G06F 3/064* (2013.01); *G06F 3/0679* (2013.01)
(58) Field of Classification Search
    CPC .... G06F 3/0614; G06F 3/0625; G06F 3/0631; G06F 3/064; G06F 3/0679; G06F 11/1044
    See application file for complete search history.

(56) References Cited

U.S. PATENT DOCUMENTS

| | | | |
|---|---|---|---|
| 11,437,114 B1* | 9/2022 | Vijayrao | G11C 29/12015 |
| 2009/0044078 A1* | 2/2009 | Vogan | G11B 20/10527 |
| | | | 714/E11.062 |
| 2013/0254625 A1* | 9/2013 | Vlaiko | H03M 13/2707 |
| | | | 714/763 |
| 2017/0255552 A1* | 9/2017 | Chatterjee | G11C 11/4096 |
| 2019/0043552 A1* | 2/2019 | Alameer | G06F 12/08 |
| 2019/0188074 A1* | 6/2019 | Coteus | G11C 29/52 |
| 2020/0226019 A1* | 7/2020 | Hornung | G06F 11/108 |
| 2020/0233819 A1* | 7/2020 | Oh | G11C 5/04 |
| 2021/0089395 A1* | 3/2021 | Song | G06F 1/08 |

(Continued)

OTHER PUBLICATIONS

Kim, Jungrae, Michael Sullivan, Seong-Lyong Gong, and Mattan Erez. "Frugal ecc: Efficient and versatile memory error protection through fine-grained compression." In Proceedings of the International Conference for High Performance Computing, Networking, Storage and Analysis, pp. 1-12. 2015.*

(Continued)

*Primary Examiner* — Tracy A Warren
(74) *Attorney, Agent, or Firm* — Hoffman Warnick LLC

(57) ABSTRACT

A self-managed DRAM module configured to reduce energy consumption. A module is described that includes a plurality of DDR channels and a management engine configured to read and write data blocks to DDR channels according to a process that includes: allocating a set of sub-channels for each DDR channel, wherein each sub-channel includes a subset of the set of DRAM chips; wherein a write operation of a data block includes: encoding the data block to generate an ECC codeword; and writing the ECC codeword into the subset of DRAM chips of a specified sub-channel; and wherein a read operation of the data block includes: reading the ECC codeword from the subset of DRAM chips of the specified sub-channel; and decoding the ECC codeword to obtain the data block.

7 Claims, 13 Drawing Sheets

(56) References Cited

U.S. PATENT DOCUMENTS

2021/0191811 A1* 6/2021 Galbi ................. G06F 11/108
2021/0194506 A1* 6/2021 Symons ............... H03M 13/19

OTHER PUBLICATIONS

Xu, Xiaolong, Peipei Gong, and Jia Xu. "Data folding: A new data soft destruction algorithm." In 2014 Sixth International Conference on Wireless Communications and Signal Processing (WCSP), pp. 1-6. IEEE, 2014.*

* cited by examiner

REDUCING ENERGY CONSUMPTION OF SELF-MANAGED DRAM MODULES

TECHNICAL FIELD

The present invention relates to the field of solid-state memory, and particularly to reducing the energy consumption of DRAM (dynamic random-access memory) modules.

BACKGROUND

Modern computers use DRAM (dynamic random-access memory) chips to implement memory systems. In conventional practice, each CPU chip connects to its exclusively owned/controlled DRAM modules, typically in the form of DIMM (dual in-line memory module), through dedicated DDR (double data rate) channels. Each CPU chip incorporates one or multiple DRAM controllers, and each DRAM controller is responsible for controlling all the DRAM chips on one DDR channel. As a result, the number of DRAM controllers inside a CPU chip determines the maximum DRAM capacity and bandwidth that are directly available to the CPU. Due to the high implementation complexity of DRAM controllers and hardware resources (e.g., the CPU chip pins) consumed by each DDR channel, modern CPUs can only integrate a relatively small number (e.g., 2 or 4) of DRAM controllers, leading to a limited DRAM capacity and bandwidth that are directly available to the CPU. Meanwhile, it is very difficult for a group of CPUs to share/pool their DRAM resources to improve the overall memory utilization efficiency.

To facilitate the DRAM capacity/bandwidth expansion and pooling, the computing industry has developed open standards, in particular CXL (compute express link), that allow CPU-memory connections over high-speed PCIe links. In this context, much of DRAM control/management functionalities are migrated from CPUs into the DRAM modules, leading to self-managed DRAM modules in contrast to the conventional CPU-managed DRAM modules. Because modern CPUs could communicate with other devices through many PCIe lanes/channels, CPUs could connect to many self-managed DRAM modules (e.g., CXL-based DRAM modules) to expand their memory capacity/bandwidth. Moreover, unlike conventional CPU-managed DRAM modules, one self-managed DRAM module can directly connect to multiple CPUs. Hence a self-managed DRAM module could be easily shared among multiple CPUs, which allows multiple CPUs pool memory resources together to improve the overall memory utilization efficiency.

SUMMARY

Accordingly, an embodiment of the present disclosure is directed to methods for reducing the energy consumption of self-managed DRAM modules in computing systems.

A first aspect includes a self-managed DRAM module, comprising: a plurality of DDR channels, each DDR channel having n+2 DRAM chips; and a management engine configured to read and write data blocks to DDR channels according to a process that includes: allocating a set of sub-channels for each DDR channel, wherein each sub-channel includes (n+2)/2 DRAM chips; wherein a write operation of a data block includes: encoding the data block to generate a b(n+2)-byte ECC codeword; and writing 2b bytes of the b(n+2)-byte ECC codeword into each of the (n+2)/2 DRAM chips of a specified sub-channel; and wherein a read operation of the data block includes: reading 2b bytes from each of the (n+2)/2 DRAM chips of the specified sub-channel to obtain the b(n+2)-byte ECC codeword; and decoding the b(n+2)-byte ECC codeword to obtain the data block.

A second aspect provide a self-managed DRAM module, comprising: a plurality of DDR channels, each DDR channel having a set of DRAM chips; and a management engine configured to read and write data blocks to DDR channels according to a process that includes: allocating a set of sub-channels for each DDR channel, wherein each sub-channel includes a subset of the set of DRAM chips; wherein a write operation of a data block includes: encoding the data block to generate an ECC codeword; writing the ECC codeword into the subset of DRAM chips of a specified sub-channel; and wherein a read operation of the data block includes: reading the ECC codeword from the subset of DRAM chips of the specified sub-channel; and decoding the ECC codeword to obtain the data block.

A third aspect provides a self-managed DRAM module, comprising: a plurality of DDR channels, each DDR channel having a set of DRAM chips; and a management engine configured to read and write data blocks to DDR channels, wherein a write operation of a data block in a DDR channel is implemented according to a process that includes: compressing the data block to generate a compressed data block; encoding the compressed data block to obtain a punctured ECC codeword; determining a reduced number of DRAM chips in the DDR channel required to store the punctured ECC codeword; storing metadata indicative of the reduced number; and writing the punctured ECC codeword to the reduced number of DRAM chips in the DDR channel.

A fourth aspect provides a self-managed DRAM module, comprising: a plurality of DDR channels, each DDR channel having a set of DRAM chips; and a management engine configured to read and write data blocks to DDR channels, wherein a write operation of a data block in a DDR channel is implemented according to a process that includes: compressing the data block to generate a compressed data block; encoding the compressed data block to obtain a punctured ECC codeword; determining a reduced number of DRAM chips in the DDR channel required to store the punctured ECC codeword; storing metadata indicative of the reduced number; determining a subset number of DRAM chips of the reduced number of DRAM chips in the DDR channel into which the punctured ECC codeword can be folded; and storing the punctured ECC codeword into the subset number of DRAM chips.

A fifth aspect provides a self-managed DRAM module, comprising: a plurality of DRAM chips; and a management engine configured to read and write data blocks to the DRAM chips, wherein a write operation is implemented according to a process that includes: allocating a sequential region of memory space in the DRAM chips; collecting sequential data in a write buffer; compressing a data chunk of sequential data from the write buffer to form a compressed data chunk; and writing the compressed data chunk to the sequential region.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

A challenge of integrating larger amounts of DRAM capacity through deploying self-managed DRAM modules is that the total DRAM energy consumption will accordingly increase. Various techniques are provided herein to minimize energy consumption of self-managed DRAM modules.

Figure 1:
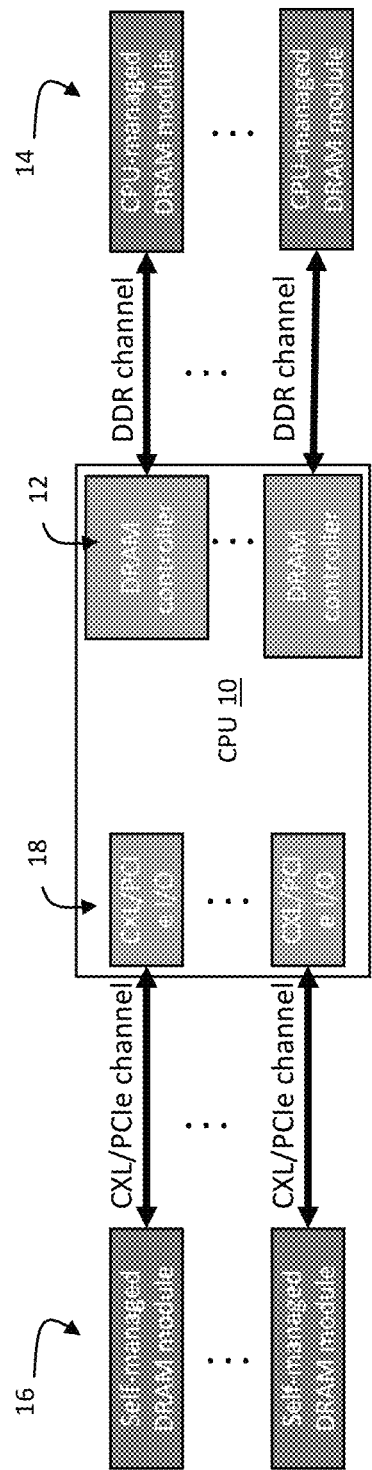
FIG. 1 illustrates a CPU connecting to both CPU-managed DRAM modules through DDR channel and self-managed DRAM modules through CXL/PCIe channel.

FIG. 1 illustrates a CPU 10 connected with both CPU-managed DRAM modules 14 through DDR (double data rate) channels and self-managed DRAM modules 16 through CXL/PCIe channels. All the DRAM modules 14 on one DDR channel are fully controlled/managed by one DRAM controller 12 inside the CPU chip 10. Using an integrated CXL/PCIe I/O engine 18 (that is much simpler than a DRAM controller), the CPU 10 connects to one self-managed DRAM module 16 through a CLX/PCIe channel.

Each self-managed DRAM module 16 internally controls/manages the DRAM chips on its own and serves requests (e.g., data read and write) from the CPU 10 through the CXL/PCIe channel.

Figure 2:
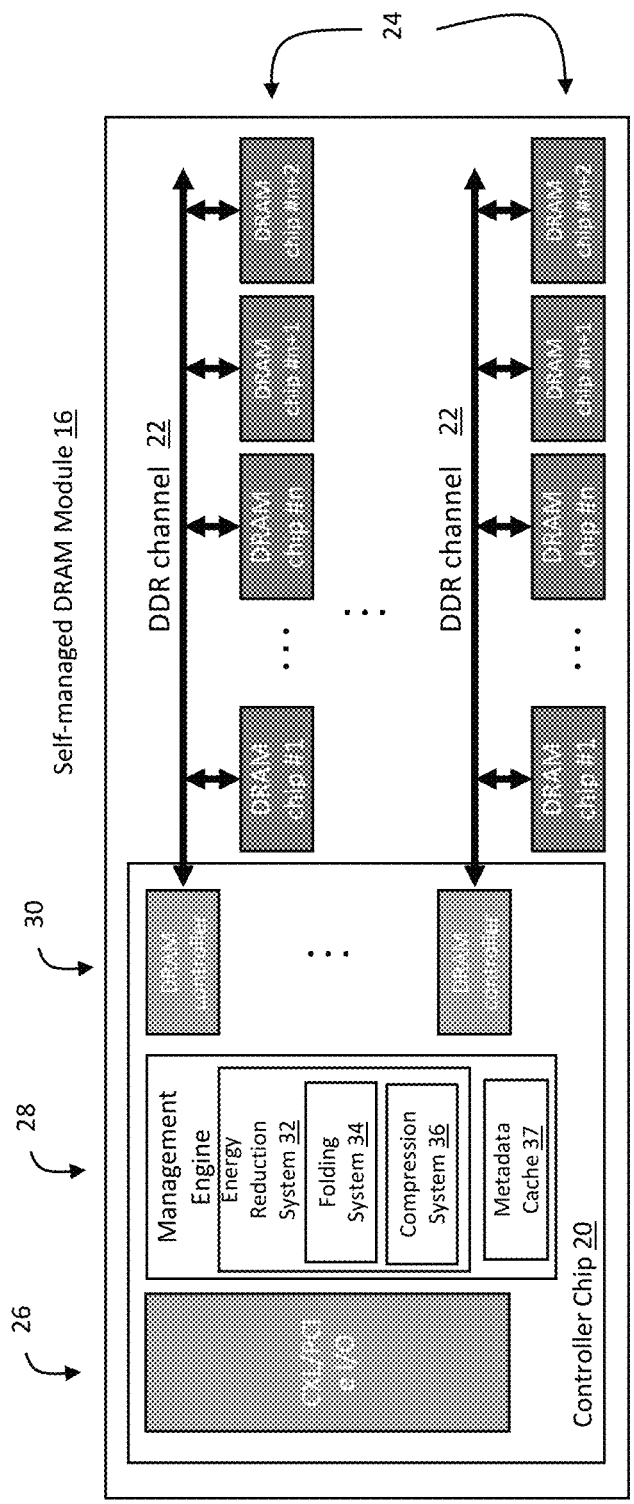
FIG. 2 illustrates the architecture of a self-managed DRAM module.
Figure 3:
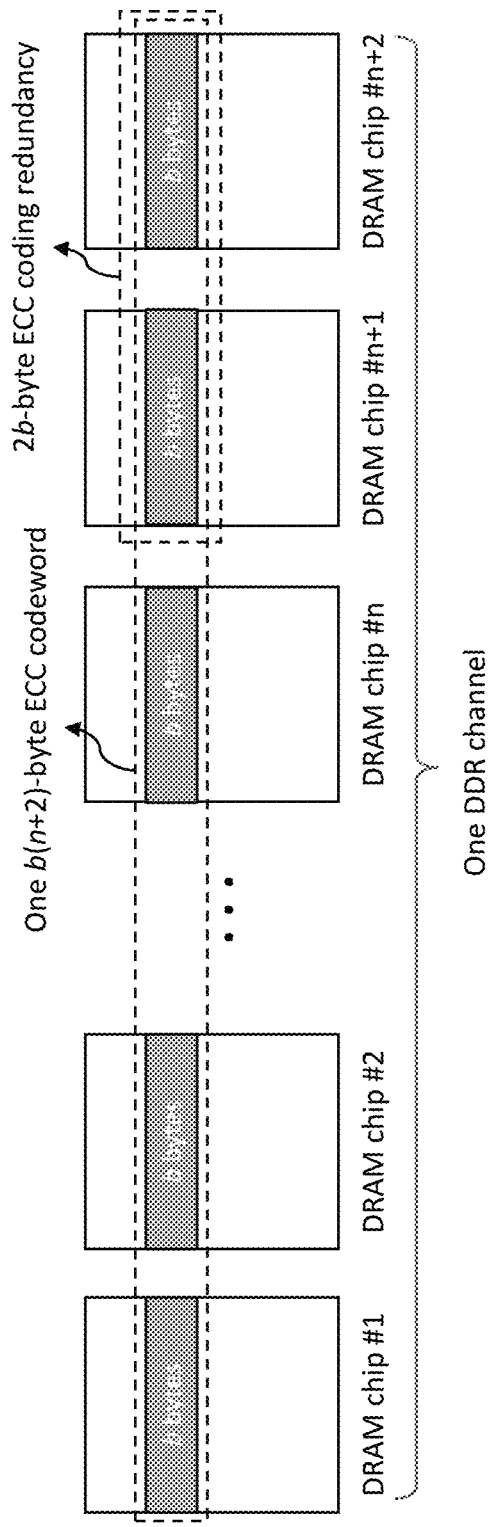
FIG. 3 illustrates one ECC codeword being stored across all the n+2 DRAM chips on one DDR channel.

FIG. 2 illustrates the architecture of a self-managed DRAM module 16 that contains a controller chip 20 and multiple DRAM chips 24. All the DRAM chips 24 are organized into m DDR channels 22, where each channel 22 hosts n+2 DRAM chips. As illustrated in FIG. 2, the controller chip 20 contains (i) a CXL/PCIe I/O engine 26 to communicate with the host CPU, (ii) m DRAM controllers 30, each one controls all the n+2 DRAM chips on one DDR channel 22, and (iii) a management engine 28 that is responsible for the RAS (reliability, availability, and serviceability) of the entire DRAM module 16. To ensure memory module reliability, the management engine 28 protects data with an ECC (error correction code), where ECC coding redundancy typically covers two DRAM chips on each channel to tolerate a catastrophic failure of one DRAM chip. Therefore, among the total n+2 DRAM chips on each DDR channel, n chips store user data and two chips store ECC coding redundancy. Suppose the CPU 10 accesses the self-managed DRAM module 16 in the unit of b·n bytes (e.g., the data access unit is 64 bytes if both b and n are 8). Given the n chips per DDR channel for user data storage, each DRAM chip stores b bytes in each b·n-byte data block. Meanwhile the data management engine protects each b·n-byte data block with 2b-byte ECC coding redundancy, where the 2b-byte ECC coding redundancy is stored over 2 DRAM chips. Hence, as illustrated in FIG. 3, the ECC codeword length is b·(n+2) bytes, and each ECC codeword is stored across all the n+2 DRAM chips on one DDR channel, where each DRAM chip stores b bytes.

DRAM data access energy efficiency heavily depends on the read/write amplification, which is explained as follows. Each DRAM die contains multiple independent DRAM banks, each bank consists of a large array of DRAM cells at the cross-points of many horizontal rows and vertical columns. Let $N_{rc}$ denote the number of DRAM cells on each row, where a typical value of $N_{rc}$ could be a few thousand. Regardless how many bits one needs to read/write from/to one row, the DRAM bank must internally read all the $N_{rc}$ bits from the entire row and then write them back to ensure the data storage integrity. Therefore, reading 1 bit or 500 bits from one row would consume almost the same amount of energy. When a DRAM chip serves a data access request, let $N_a$ denote the number of bits that are being read/written from/to a row. The DRAM data access read/write amplification is defined as $N_{rc}/N_a$. The overall DRAM access energy efficiency improves as the read/write amplification reduces. To improve the overall memory access throughput, systems tend to stripe logically consecutive data blocks across different memory channels and even banks, which however will result in higher read/write amplification and hence worse memory access energy efficiency.

As discussed above, when storing each b·(n+2)-byte ECC codeword over n+2 DRAM chips on one DDR channel, each DRAM chip stores b bytes. Therefore, when accessing one data block, the DRAM read/write amplification will be $N_{rc}/8b$. Given the large value of $N_{rc}$ (e.g., a few thousand) and small value of b (e.g., 8), the read/write amplification can be very large (e.g., several hundred), leading to a very poor DRAM data access energy efficiency.

Various techniques are presented that can be implemented by the management engine 28 in the self-managed DRAM module controller chip to reduce the DRAM read/write amplification and hence improve the DRAM access energy efficiency. In the embodiment shown in FIG. 2, an energy reduction system 32 is provided that can implemented one or both of a folding system 34 and a compression system 36.

The first technique implemented by folding system 34 provides per-channel ECC codeword folding. It is motivated by two observations: (1) Different applications may demand different levels of in-memory data storage reliability. For example, multimedia processing applications typically have much less stringent requirement on DRAM reliability than financial/banking applications. (2) Even without system-level ECC implemented by the controller chip, DRAM chips themselves could already ensure a reliability that can be sufficient to many applications. For the memory region used by applications with less stringent requirement on in-memory data storage reliability, this approach presents a technique to reduce the DRAM energy consumption.

Figure 4:
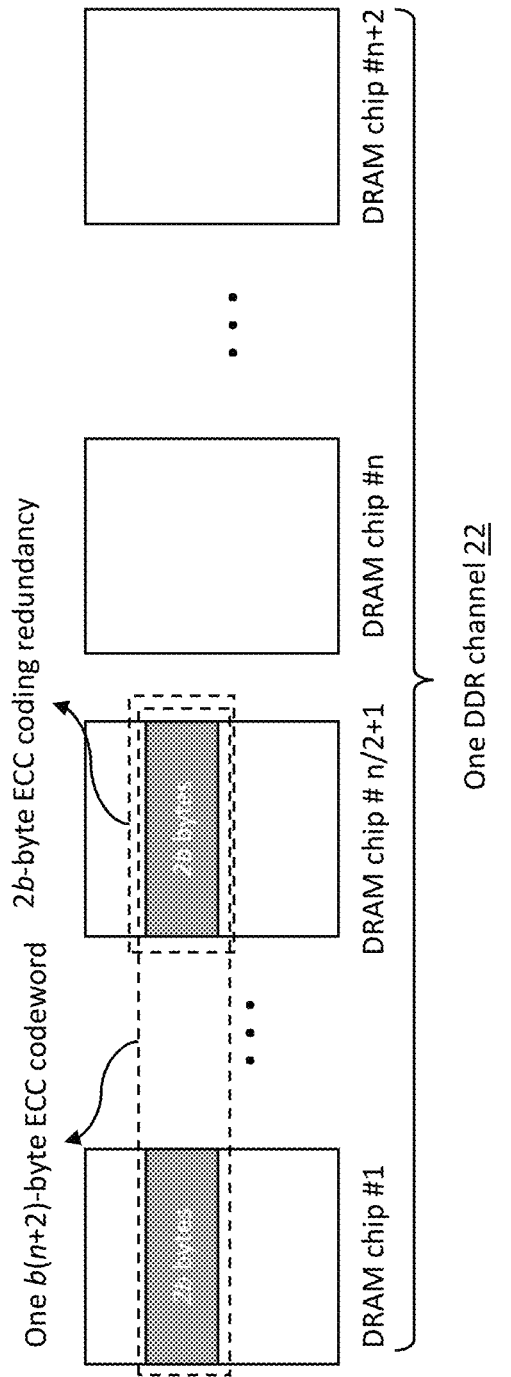
FIG. 4 illustrates per-channel ECC codeword folding design technique.

As illustrated in FIG. 4, each b-(n+2)-byte ECC codeword is stored across n/2+1 DRAM chips (assuming n is an even number), rather than n+2 DRAM chips as in conventional practice. As a result, one DRAM chip stores 2b bytes of each ECC codeword. This can be considered as folding an ECC codeword over half of the DRAM chips on one DDR channel 22. Accordingly, the DRAM access read/write amplification reduces from $N_{rc}/8b$ to $N_{rc}/16b$, leading to 2× better DRAM energy efficiency. As the penalty, the latency of reading one ECC codeword will slightly increase. Since all the 2b-byte ECC coding redundancy in each ECC codeword is stored in a single DRAM chip, the ECC cannot simultaneously mitigate random bit errors and a catastrophic DRAM chip failure, leading to a lower in-memory data storage reliability.

In one embodiment of per-channel ECC codeword folding, the self-managed DRAM module 16 partitions the entire memory space into two regions with and without per-channel ECC codeword folding, denoted as the folded region and normal region. This allows the engine to selectively use folding, e.g., based on the address/criticality of the data. In one approach, all the n+2 DRAM chips on a DDR channel 24 are grouped into two sub-channels, each sub-channel contains a subset of n/2+1 DRAM chips and can be controlled independently from the other sub-channel.

Figure 5:
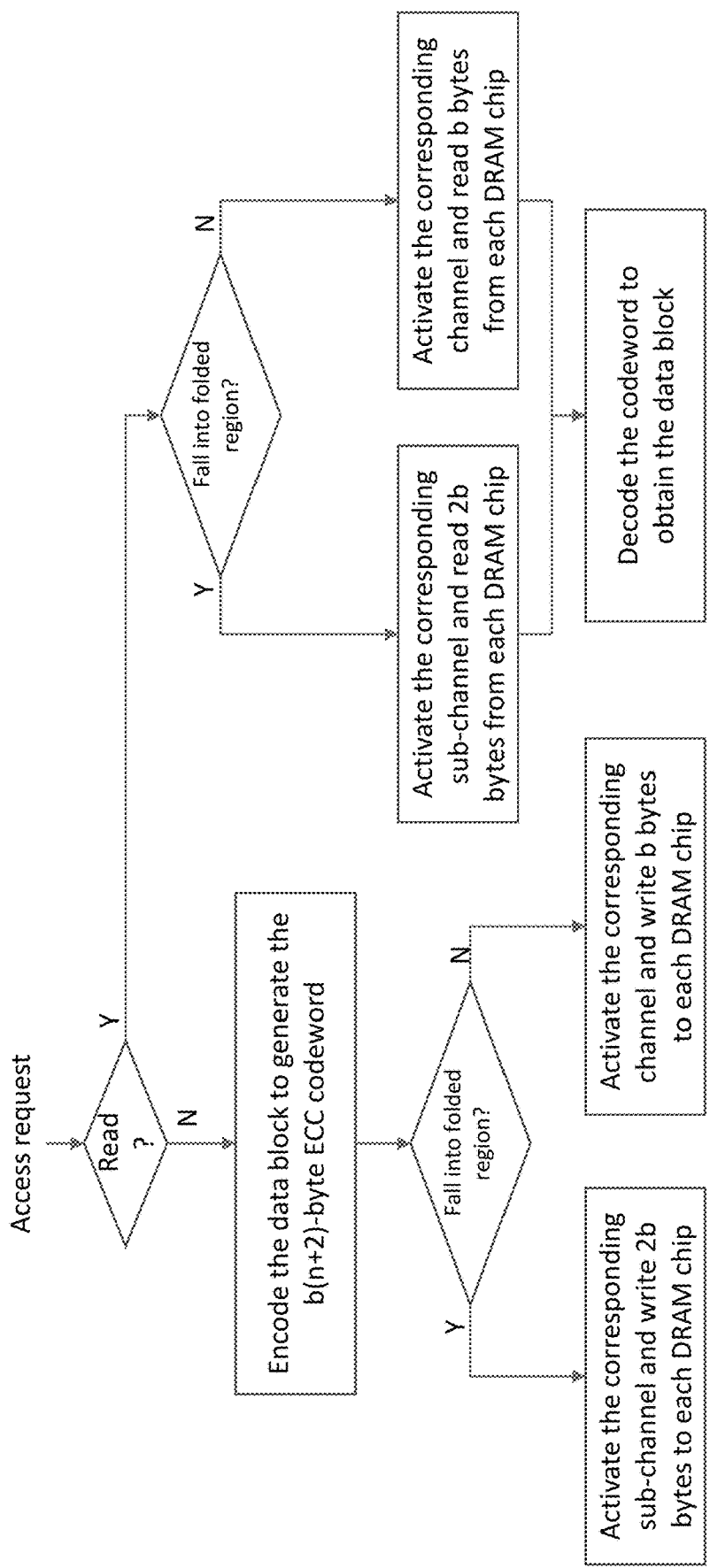
FIG. 5 illustrates the operational flow diagram of serving a data access request in the presence of the invented per-channel ECC codeword folding.

An illustrated process for write and read operations is shown in FIG. 5. In the case of a write operation (left side), the data block being written will be encoded into a b(n+2)-byte ECC codeword. For example, if the block was 64 bytes, an additional 16 bytes of redundancy would be added to create an 80 byte ECC code word. Next, the controller chip checks whether the address falls into the folded region or normal region. If the block falls into the folded region, the controller chip will activate the n/2+1 DRAM chips in the corresponding sub-channel and write 2b bytes into each chip to serve the request at a lower energy consumption. If the block falls into the normal region, the controller chip will activate all the n+2 DRAM chips in the channel and write b bytes into each chip to serve the request at a higher energy consumption.

During a read operation, the controller chip will first check if the address falls into the folded region. If yes, the corresponding sub-channel is activated to serve the request and read 2b bytes from each DRAM chip. If no, the corresponding channel is activated, and b bytes are read from each chip.

The compression system 36 (FIG. 2) implements a second technique that provides per-channel ECC codeword puncturing. It is motivated by one observation that in-memory data tend to have high compressibility even under small compression block size. As discussed above, CPUs access self-managed DRAM modules in the unit of b·n bytes, and each b·n-byte data block is protected by 2b ECC coding redundancy. Assume one b·n-byte data block can be compressed to b-(n-k) bytes (where 0≤k<n), the original b-(n+2)-byte ECC codeword can be directly punctured into a shorter b-(n-k+2)-byte ECC codeword.

Figure 6:
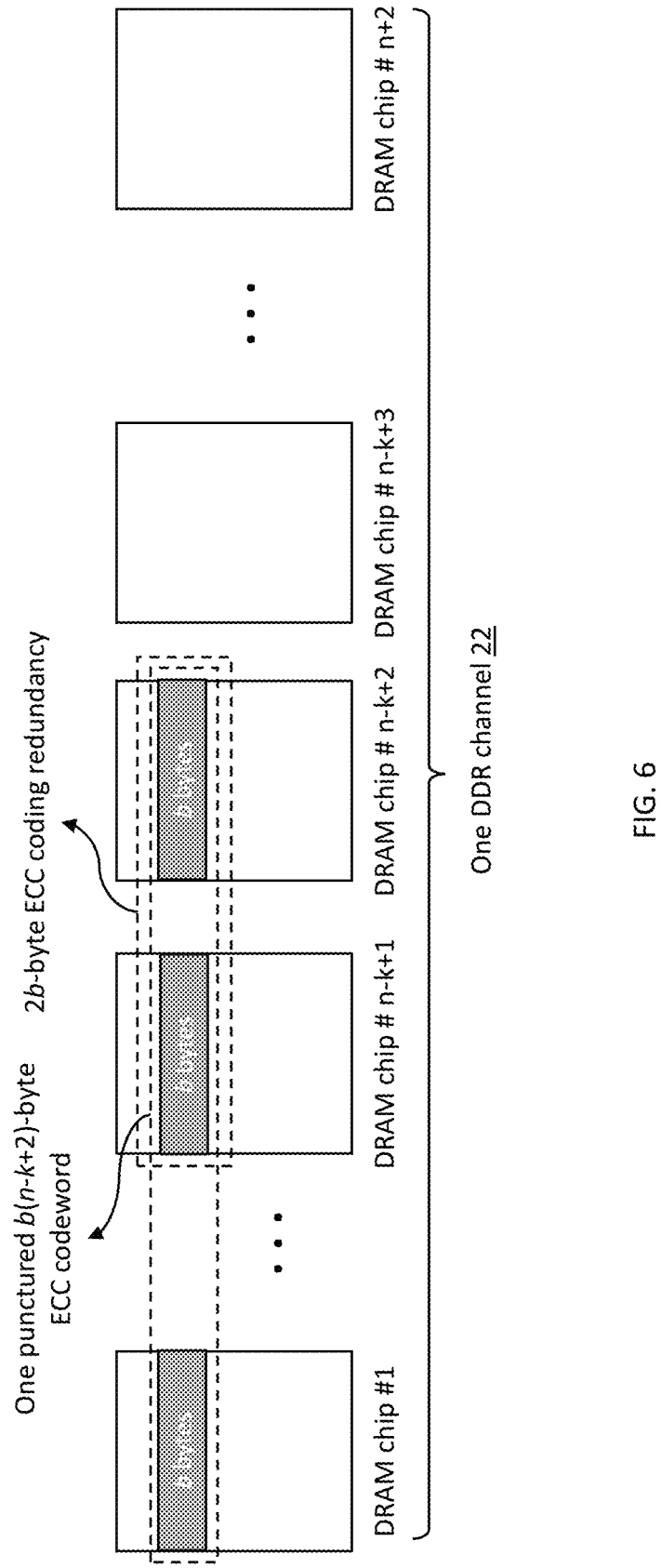
FIG. 6 illustrates per-channel ECC codeword puncturing design technique.

Accordingly, as illustrated in FIG. 6, the punctured ECC codeword can be stored in n-k+2 DRAM chips on one channel by leaving the other k DRAM chips inactivated, which will reduce the total DRAM energy consumption. Due to the runtime variation of data block compressibility, the value of k will vary from one block to the other. For each b·n-byte data block, the self-managed DRAM module 16 stores an s-bit metadata to represent $2^s$ different values of k, where 1≤s.

Figure 7:
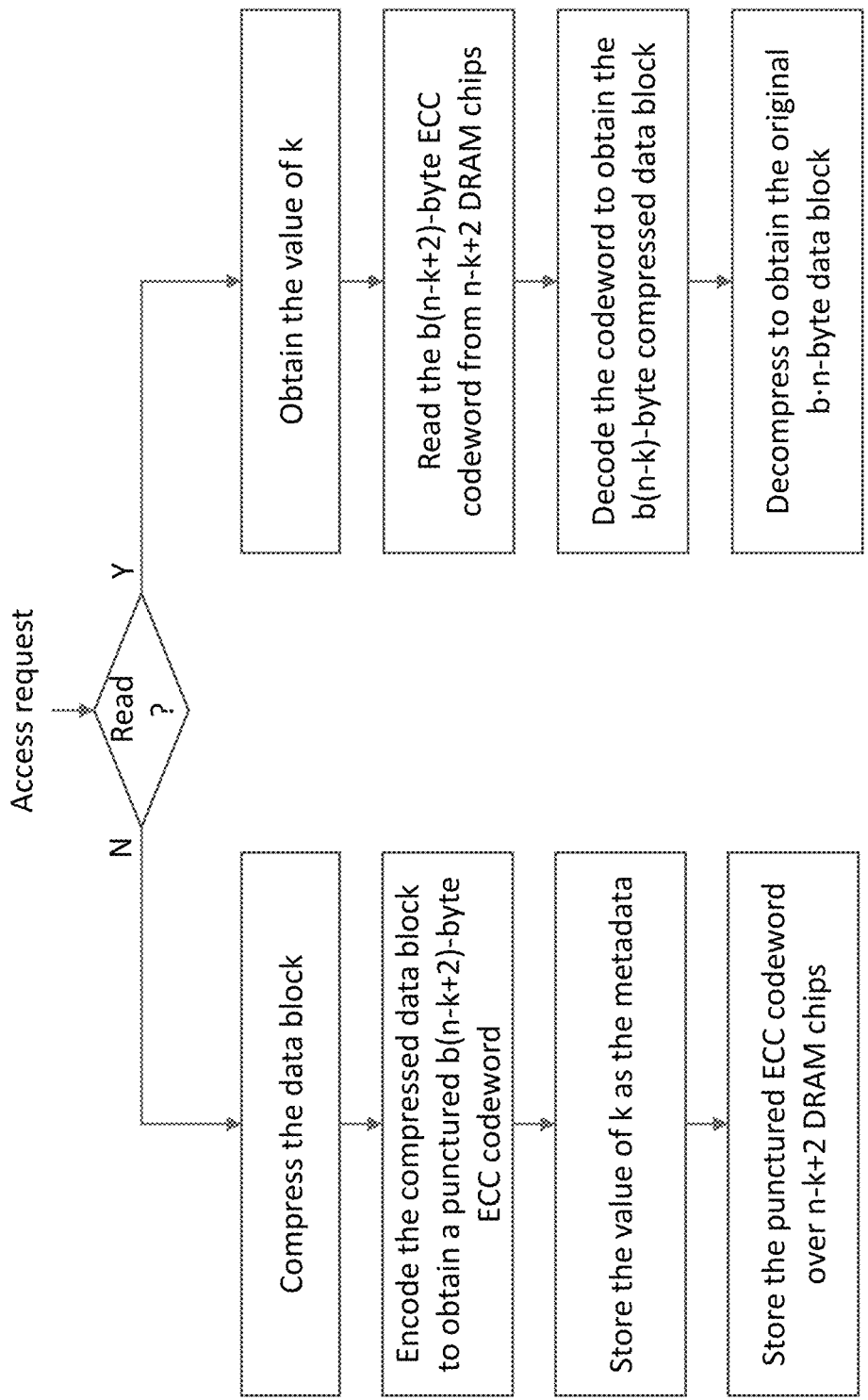
FIG. 7 illustrates the operational flow diagram of serving a data access request in the presence of per-channel ECC codeword puncturing.

As illustrated in FIG. 7, to serve a write request, the controller chip first compresses the b·n-byte data block and records its corresponding s-bit metadata, and then accordingly carries out ECC encoding to generate a punctured ECC codeword with the length of b-(n-k+2) bytes and writes it to n-k+2 DRAM chips on one channel by leaving the other k DRAM chips inactivated. Note that in this embodiment, regardless of the data compressibility, the DRAM module storage capacity remains the same. Each b·n-byte data block always consumes b·n-byte DRAM capacity. Once a data block is compressed to b-(n-k) bytes, the compressed data block occupies b-(n-k)-byte DRAM and leaves the rest b·k-byte DRAM capacity unused.

To serve a read request, the controller chip must first obtain the corresponding metadata to recover the value of k, and accordingly activate the n-k+2 DRAM chips to fetch the punctured ECC codeword. After ECC error detection/decoding, the controller chip carries out decompression to reconstruct the original b·n-byte data block.

Various approaches may be utilized to store the metadata values for each data block. Ideally, to minimize latency, the metadata can be stored on the controller chip itself. However, since the controller chip may not have enough on-chip memory to keep the metadata of all the data blocks, part (or even most) of metadata must be stored in DRAM. This however could cause significant data access latency overhead since the controller chip has to access DRAM twice (first read metadata from DRAM, then read punctured ECC codeword from DRAM) to serve one read request. To mitigate this latency issue, a per-page metadata caching design technique may be employed. This technique is motivated by the strong data access spatial locality within a page, i.e., if one data block is accessed, the other data blocks in the same 4 KB page may be more likely accessed subsequently. Accordingly, in one illustrative approach, for all the metadata of data blocks that belong to the same 4 KB page, the controller puts the "related" metadata together into a metadata group. The controller chip can then use its on-chip memory to cache most recently accessed metadata groups.

Figure 8:
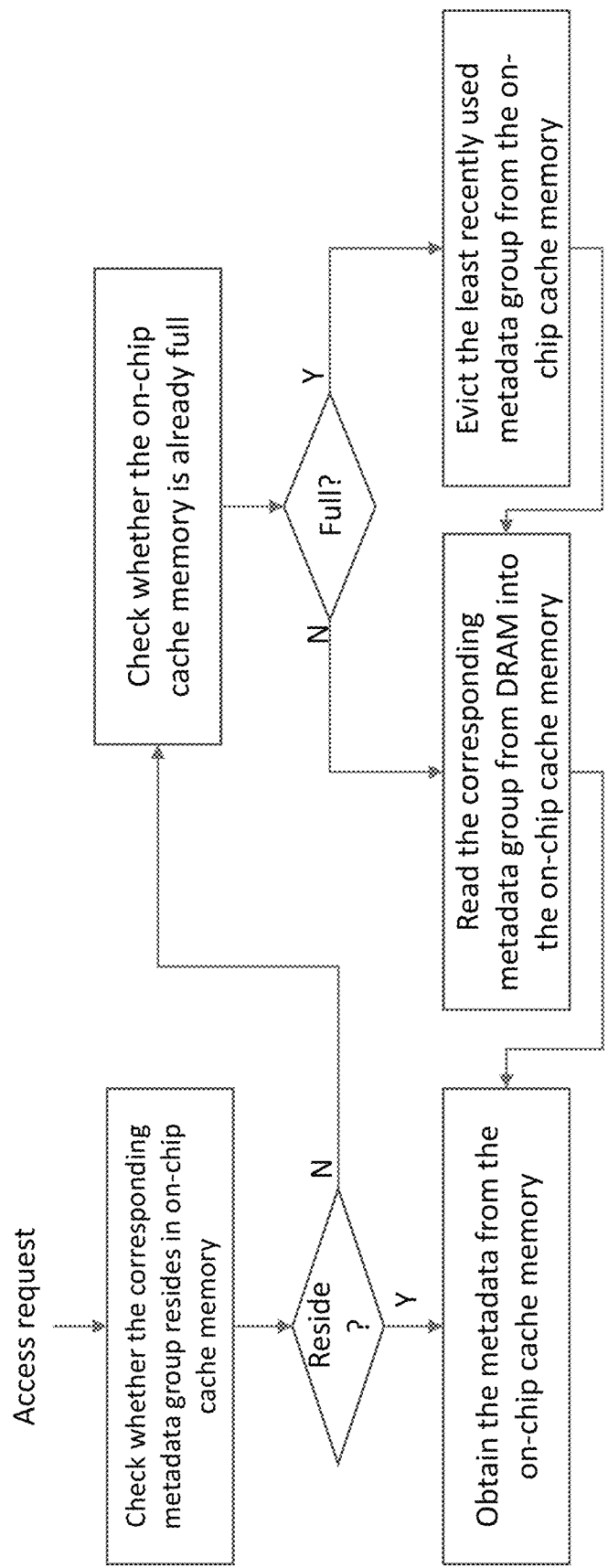
FIG. 8 illustrates the operational flow diagram of utilizing the metadata group caching to reduce the latency overhead of per-channel ECC codeword puncturing.

As illustrated in FIG. 8, when serving a read or write request, the controller chip first checks whether its associated metadata group has been cached in the on-chip cache memory. If the metadata group resides in the on-chip cache memory, the controller chip will directly obtain the metadata without accessing DRAM. Otherwise, the controller chip will fetch the metadata group from the DRAM, and then accordingly serve the data access request. In the approach shown in FIG. 8, if the metadata group does not reside in the on-chip cache memory, a check is made to determine if the on-chip cache memory is full. If no, the metadata group is read from DRAM into the on-chip cache memory and the required metadata is read from the on-chip cache memory. If the on-chip cache memory is full, the least recently used metadata group is removed from the on-chip cache memory, the metadata group is read from DRAM into the on-chip cache memory and the required metadata is read from the on-chip cache memory.

Figure 9:
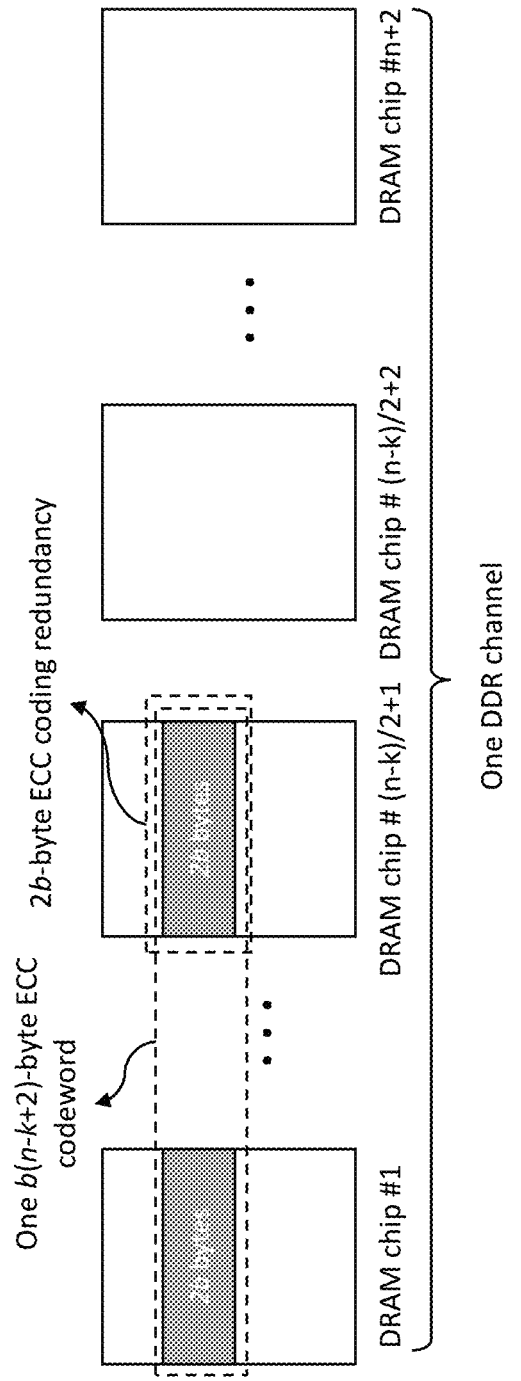
FIG. 9 illustrates the direct per-channel ECC codeword puncturing/folding combination with reduced in-memory data reliability.
Figure 10:
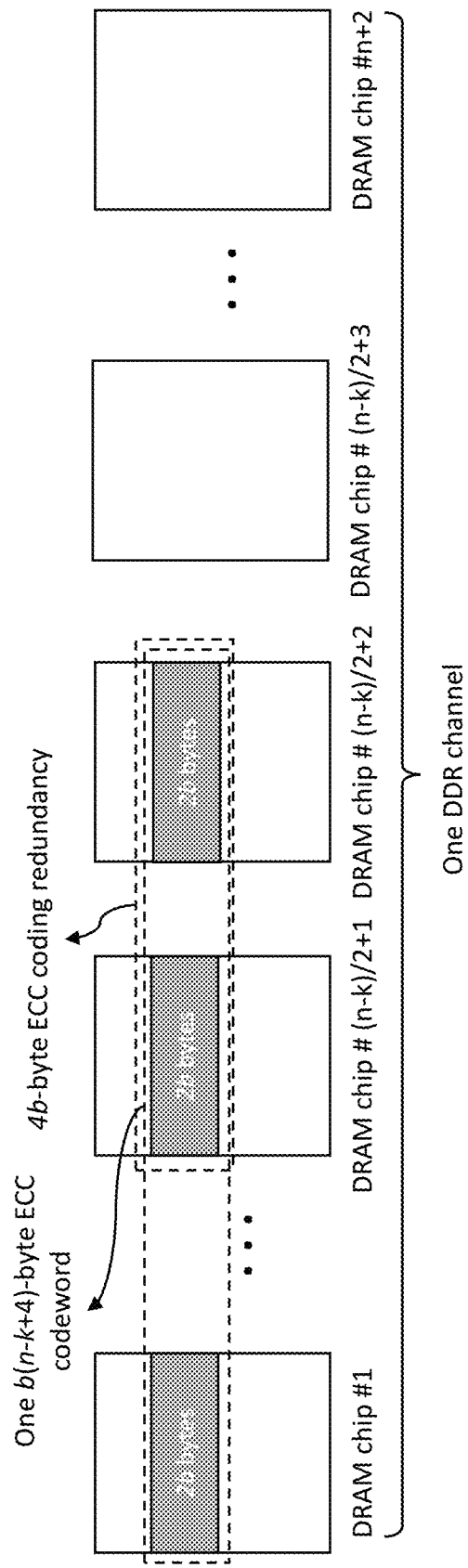
FIG. 10 illustrates the strengthened per-channel ECC codeword puncturing/folding combination with full in-memory data reliability.

The above presented two design techniques, per-channel ECC codeword folding and per-channel ECC codeword puncturing, can be combined to further improve the DRAM energy efficiency. As illustrated in FIG. 9, one punctured ECC codeword with the length of b-(n-k+2) bytes can be directly folded over (n-k+2)/2 DRAM chips, where each chip DRAM stores 2b bytes. This is referred to as direct per-channel ECC codeword puncturing/folding combination, where all the 2b ECC coding redundancy is stored in a single DRAM chip. Same as the per-channel ECC codeword folding, this approach cannot simultaneously mitigate random bit errors and a catastrophic DRAM chip failure, leading to a lower in-memory data storage reliability. To restore the full in-memory data storage reliability under ECC codeword folding, there must be 4b ECC coding redundancy that are stored in two different DRAM chips, each DRAM chip stores 2b ECC coding redundancy. As a result, the punctured ECC codeword contains b−(n−k+4) bytes, consisting of b−(n−k)-byte compressed data block and 4b-byte ECC coding redundancy. Under the per-channel ECC codeword folding, as illustrated in FIG. 10, the punctured ECC codeword is stored over (n−k)/2+2 DRAM chips, each DRAM chip stores 2b bytes. This is referred to as strengthened per-channel ECC codeword puncturing/folding combination.

Figure 11:
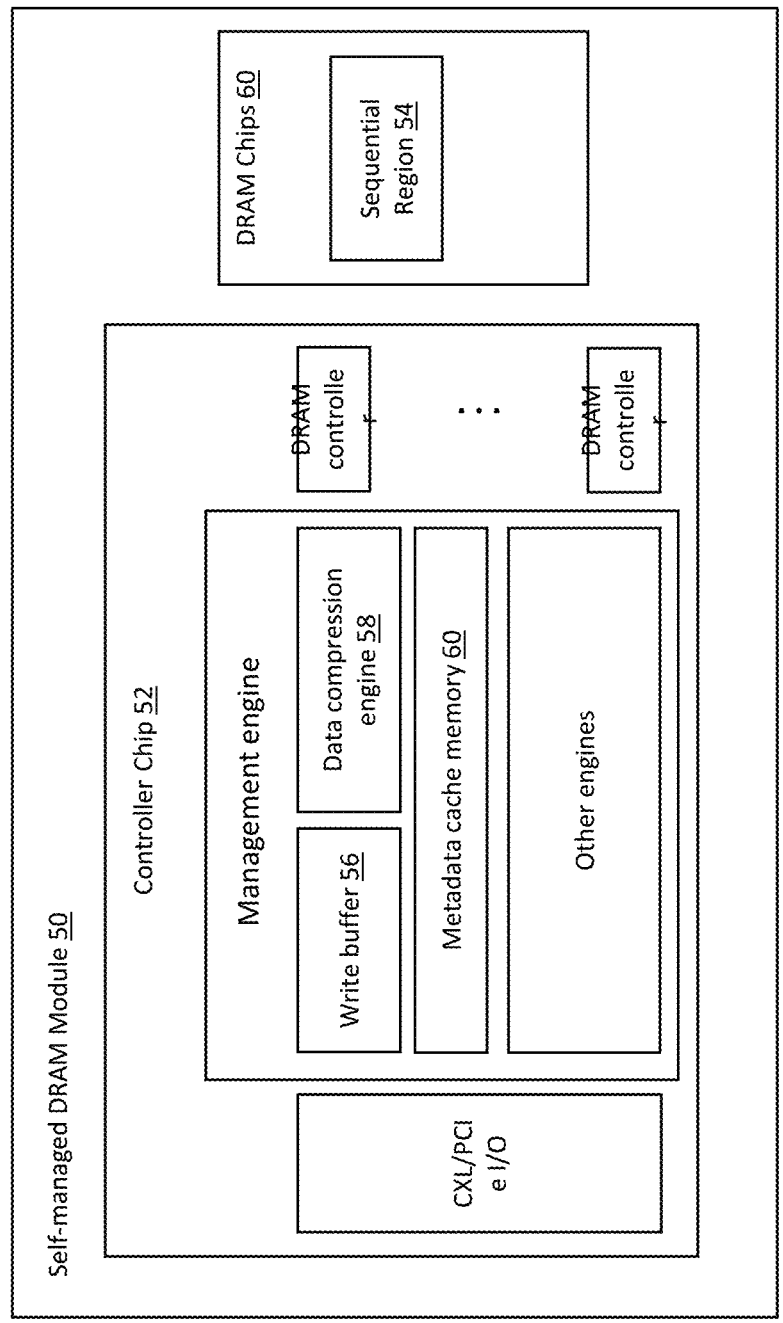
FIG. 11 illustrates the controller chip architecture in support of coarse-grained compression assisted energy reduction.
Figure 12:
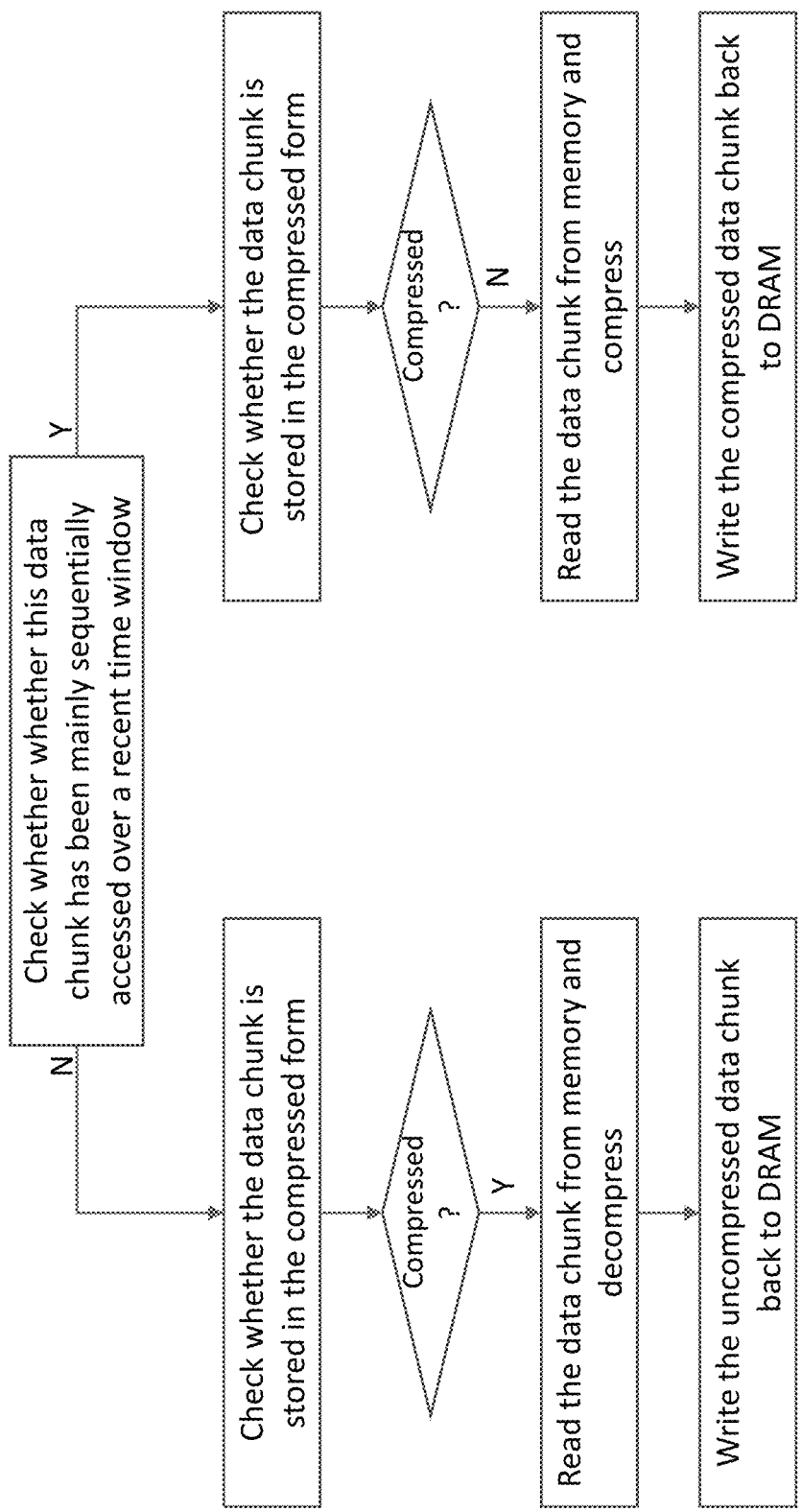
FIG. 12 illustrates the operational flow diagram of detecting and handling the mismatch between the data chunk storage format and data chunk access characteristics for data chunks stored in the sequential region.
Figure 13:
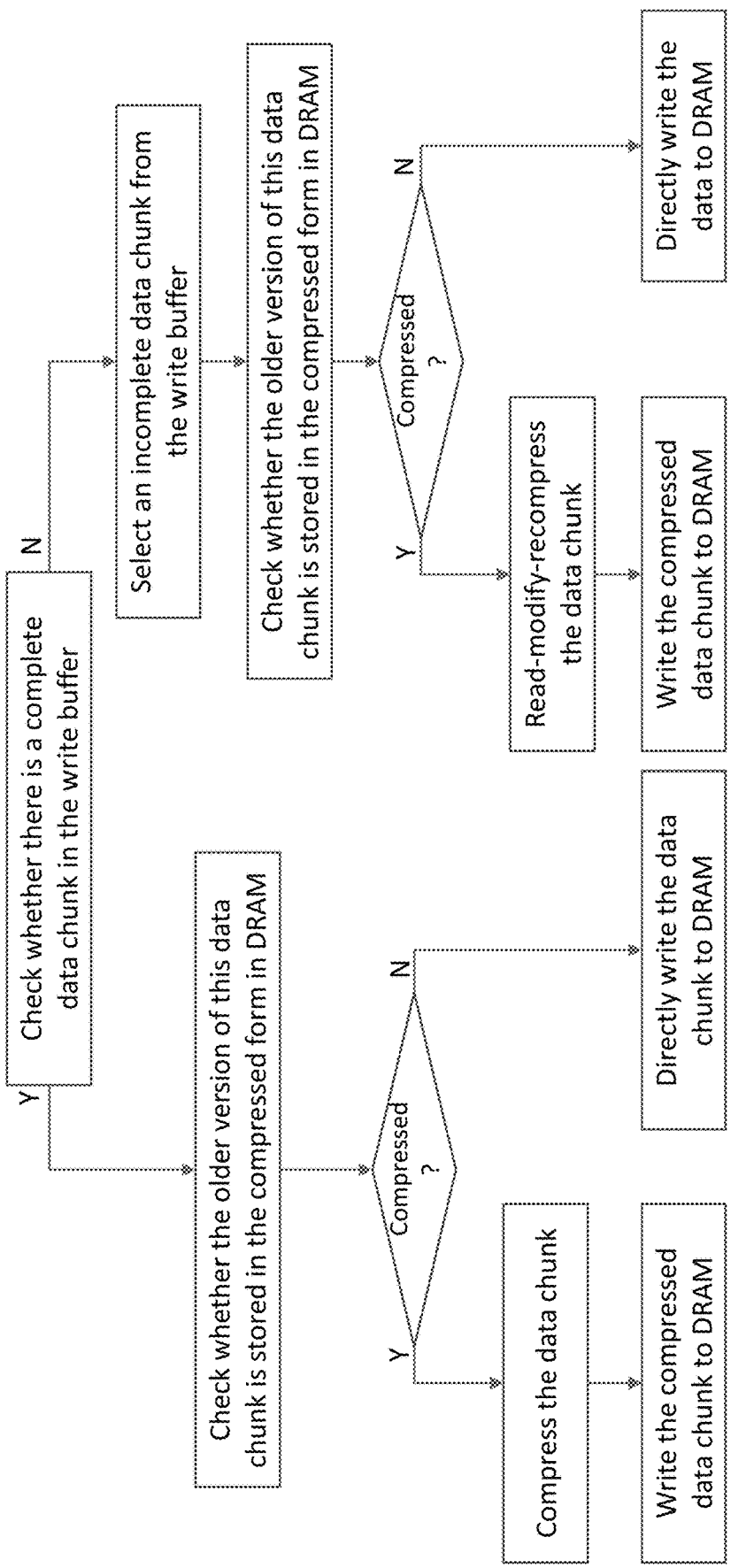
FIG. 13 illustrates the operational flow diagram of migrating data from write buffer into DRAM for data chunks stored in the sequential region.

A further design technique described generally in FIG. 11-13 reduces the memory energy consumption for in-memory data that are mostly sequentially accessed. Many big data processing systems heavily involve sequentially scanning through a large amount of data. To reduce the energy consumed by sequential scanning, this technique presents two tactics: (1) The self-managed DRAM module internally compresses the data in the unit of large chunks (e.g., 2 KB or 4 KB) to reduce the amount of data being written/read to/from DRAM chips; and (2) The self-managed DRAM module disables channel/bank interleaving when storing the compressed data chunks to further reduce the read/write amplification. As discussed above, modern computing systems apply channel/bank interleaving to improve the overall memory access speed performance at the penalty of higher read/write amplification and hence worse energy efficiency. For (mostly) sequentially accessed data, even without channel/bank interleaving, DRAM should be able to achieve high speed performance. Hence, it is desirable to disable channel/bank interleaving for such data. This is referred to as coarse-grained compression assisted energy reduction.

As shown in FIG. 11, the self-managed DRAM module 50 allocates a memory space region (called sequential region) 54 solely for data that are mostly sequentially accessed. The data being written into the sequential region 54 are first buffered by the controller chip 52 in a write buffer 56. Once enough amount of sequentially written data has been accumulated in the buffer 56, the controller chip 52 will apply a coarse-grained compression (e.g., in the unit of 2 KB or 4 KB) using a data compression engine 58 and write the compressed block to DRAM chips 60. When writing each compressed block to DRAM chips 60, the controller chip 52 does not apply channel/bank interleaving so that the data are stored consecutively along the same channel of DRAM chips, leading to the minimal DRAM read/write amplification and hence the best DRAM energy efficiency. Note that, regardless of the data compressibility, the DRAM module storage capacity remains the same. Each coarse-grained chunk (e.g., 2 KB or 4 KB) always consumes the same amount of DRAM capacity (e.g., 2 KB or 4 KB). Once an N-byte data chunk is compressed to M bytes, the compressed data chunk occupies M-byte DRAM (plus corresponding ECC coding redundancy) and leaves the rest (N−M)-byte DRAM capacity unused.

Since there is no guarantee that all the data in the sequential region 54 are always sequentially accessed, the controller chip 52 keeps monitoring the data access characteristics on the per-chunk basis. Once the controller chip identifies a compressed chunk that is access more randomly at a finer granularity (e.g., 64-byte or 256-byte data per access) than sequentially, the controller chip 52 will decompress the compressed chunk and store the original uncompressed data chunk in memory. In the worst case, all the data in the sequential region 54 are stored in their original uncompressed form. For each data chunk in the sequential region 54, the controller chip keeps a small amount of metadata (e.g., a few bits) in metadata cache memory 60 to record whether the data chunk is stored either in the compressed form or uncompressed form and assist the detection of whether the data chunk has been accessed mainly sequentially or randomly. The controller chip keeps all (or most) metadata in its on-chip metadata cache memory 60.

Accordingly, FIG. 11 illustrates the architecture in support of the proposed coarse-grained compression assisted energy reduction. The controller chip 52 contains a write buffer 56 to accumulate the data being written into the sequential region 54. The coarse-grained data compression engine 58 carries out compression and decompression. The on-chip metadata cache 60 in the controller chip caches the metadata of all the data chunks.

In the background, the controller chip searches for a possible mismatch between the data chunk storage format (i.e., compressed or uncompressed) and data chunk access characteristics (i.e., mainly sequential or mainly random). Once a mismatch has been identified, the controller chip 52 will adjust the data chunk storage format to match the data chunk access characteristics.

FIG. 12 illustrates the operational flow diagram of detecting and handling the mismatch for a data chunk. For a data chunk that has been mainly sequentially accessed over a recent time window, if it is being stored in the original uncompressed format in DRAM, the controller chip will convert it into a compressed data chunk in DRAM. For a data chunk that has been mainly randomly accessed (i.e., not sequentially accessed) over a recent time window, if the data chunk is being stored in the compressed format in DRAM, the controller chip will convert the data chunk into an uncompressed data chunk in DRAM.

As discussed above, for data being written into the sequential region, the controller chip always buffers the incoming data in its write buffer and then, in the background, migrates data from the write buffer into DRAM. During the data migration, the controller chip decides whether to compress the data according to the data chunk access characteristics. Moreover, the controller chip always prioritizes migrating a complete data chunk from the write buffer to DRAM. When the controller chip must migrate an incomplete data chunk from the write buffer to DRAM, if the data chunk is currently stored in DRAM in the compressed format, it must perform the read-modify-recompress-write operation.

FIG. 13 illustrates the operational flow diagram of migrating data from write buffer into DRAM. When a complete chunk exists in the write buffer, a check is made whether an older version is stored and compressed in DRAM. If an old version is stored/compressed, the data chunk is compressed and written to DRAM. If not, the data chunk is directly written to DRAM. If there is not a complete data chunk in the buffer, then an incomplete data chunk is selected from the write buffer and a check is made whether an older version is stored and compressed in DRAM. If an old version is stored/compressed, the older data chunk is read, modified and recompressed and written to DRAM. If not, the data chunk is directly written to DRAM.

It is understood that aspects of the present disclosure may be implemented in any manner, e.g., as a software/firmware program, an integrated circuit board, a controller card, etc., that includes a processing core, I/O and processing logic. Aspects may be implemented in hardware or software, or a combination thereof. For example, aspects of the processing logic may be implemented using field programmable gate arrays (FPGAs), ASIC devices, or other hardware-oriented systems.

Aspects may be implemented with a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, etc. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. The computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by hardware and/or computer readable program instructions.

The flowcharts and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the present disclosure has been presented for purposes of illustration and description. It is not intended to be exhaustive or to limit the concepts disclosed herein to the precise form disclosed, and obviously, many modifications and variations are possible. Such modifications and variations that may be apparent to an individual in the art are included within the scope of the present disclosure as defined by the accompanying claims.

The invention claimed is:

1. A method of implementing a self-managed dynamic random-access memory (DRAM) module, comprising:
   providing a plurality of double data rate (DDR) channels, each DDR channel having n+2 DRAM chips; and
   allocating a set of sub-channels for each DDR channel, wherein each sub-channel includes (n+2)/2 DRAM chips;
   performing a write operation of a data block of size b*n where b is a number of bytes, including:
   encoding the data block to generate a b (n+2)-byte error correction code (ECC) codeword;
   writing 2b bytes of the b (n+2)-byte ECC codeword into each of the (n+2)/2 DRAM chips of a specified sub-channel; and
   performing a read operation of the data block, including:

reading 2b bytes from each of the (n+2)/2 DRAM chips of the specified sub-channel to obtain the b (n+2)-byte ECC codeword; and decoding the b (n+2)-byte ECC codeword to obtain the data block.

2. The method of claim 1, wherein the write operation further includes, after the encoding:

determining whether the data block qualifies for data folding;

in response to the data block not qualifying for data folding, writing b bytes into each of the n+2 DRAM chips of a DDR channel instead of writing 2b bytes into each of the (n+2)/2 DRAM chips of the specified sub-channel.

3. The method of claim 2, wherein the read operation further includes:

determining whether the data block qualifies for data folding; and in response to the data block not qualifying for folding, reading b bytes from the n+2 DRAM chips of the DDR channel instead of reading 2b bytes from each of the (n+2)/2 DRAM chips of the specified sub-channel.

4. The method of claim 3, wherein determining whether the data block qualifies for data folding includes determining if an address of the data block falls within a predetermined memory region.

5. A self-managed dynamic random-access memory (DRAM) module, comprising:

a plurality of DDR channels, each DDR channel having a set of DRAM chips; and a controller chip configured to read and write data blocks to DDR channels according to a process that includes:

allocating a set of sub-channels for each DDR channel, wherein each sub-channel includes a subset of the set of DRAM chips;

wherein a write operation of a data block includes:

encoding the data block to generate an ECC codeword;

determining whether the data block qualifies for data folding;

in response to the data block not qualifying for data folding, writing the ECC codeword into all of the DRAM chips of a DDR channel;

in response to the data block qualifying for data folding, writing the ECC codeword into the subset of DRAM chips of a specified sub-channel; and wherein a read operation of the data block includes:

reading the ECC codeword from the subset of DRAM chips of the specified sub-channel; and decoding the ECC codeword to obtain the data block.

6. The self-managed DRAM module of claim 5, wherein the read operation further includes:

determining whether the data block qualifies for data folding; and in response to the data block not qualifying for folding, reading the ECC codeword from all of the DRAM chips of the DDR channel instead of reading the ECC codeword from the subset of DRAM chips of the specified sub-channel.

7. The self-managed DRAM module of claim 6, wherein determining whether the data block qualifies for data folding includes determining if an address of the data block falls within a predetermined memory region.

* * * * *